United States Patent
Yin et al.

(10) Patent No.: US 9,691,878 B2
(45) Date of Patent: Jun. 27, 2017

(54) METHOD OF MANUFACTURING MOSFET

(71) Applicants: Haizhou Yin, Poughkeepsie, NY (US);
Huilong Zhu, Poughkeepsie, NY (US);
Changliang Qin, Beijing (CN);
Huaxiang Yin, Beijing (CN)

(72) Inventors: Haizhou Yin, Poughkeepsie, NY (US);
Huilong Zhu, Poughkeepsie, NY (US);
Changliang Qin, Beijing (CN);
Huaxiang Yin, Beijing (CN)

(73) Assignee: Institute of Microelectronics, Chinese Academy of Science, Beijing (CN)

( * ) Notice: Subject to any disclaimer, the term of this patent is extended or adjusted under 35 U.S.C. 154(b) by 40 days.

(21) Appl. No.: 14/436,892

(22) PCT Filed: Oct. 30, 2012

(86) PCT No.: PCT/CN2012/083750
§ 371 (c)(1),
(2) Date: Apr. 19, 2015

(87) PCT Pub. No.: WO2014/063381
PCT Pub. Date: May 1, 2014

(65) Prior Publication Data
US 2015/0295068 A1 Oct. 15, 2015

(30) Foreign Application Priority Data
Oct. 23, 2012 (CN) .......................... 2012 1 0407448

(51) Int. Cl.
*H01L 29/06* (2006.01)
*H01L 29/66* (2006.01)
(Continued)

(52) U.S. Cl.
CPC .. *H01L 29/66636* (2013.01); *H01L 21/02381* (2013.01); *H01L 21/02529* (2013.01);
(Continued)

(58) Field of Classification Search
CPC .................... H01L 129/665; H01L 121/76224
(Continued)

(56) References Cited

U.S. PATENT DOCUMENTS

2005/0280052 A1* 12/2005 Holz ................... H01L 29/0653
257/288
2006/0186509 A1* 8/2006 Larsen ................ H01L 21/3086
257/506
(Continued)

FOREIGN PATENT DOCUMENTS

| CN | 101369598 | 2/2009 |
| CN | 102386226 | 3/2012 |
| CN | 102437183 | 5/2012 |

OTHER PUBLICATIONS

Office action for the counter part Chinese application CN 201210407448.6. Dec. 2015.

*Primary Examiner* — Moazzam Hossain
*Assistant Examiner* — Hajar Kolahdouzan
(74) *Attorney, Agent, or Firm* — Treasure IP Group, LLC

(57) ABSTRACT

Provided is a method for manufacturing a MOSFET, including: forming a shallow trench isolation (STI) in a semiconductor substrate to define an active region for the MOSFET; performing etching with the STI as a mask, to expose a surface of the semiconductor substrate, and to protrude a portion of the STI with respect to the surface of the semiconductor substrate, resulting in a protruding portion; forming a first spacer on sidewalls of the protruding portion; forming a gate stack on the semiconductor substrate; forming a second spacer surrounding the gate stack; forming openings in the semiconductor substrate with the STI, the gate stack, the first spacer and the second spacer as a mask; epitaxially growing a semiconductor layer with a bottom surface and sidewalls of each of the openings as a growth seed layer; and performing ion implantation into the semiconductor layer to form source and drain regions.

13 Claims, 14 Drawing Sheets

(51) Int. Cl.
*H01L 29/78* (2006.01)
*H01L 29/165* (2006.01)
*H01L 21/762* (2006.01)
*H01L 21/02* (2006.01)
*H01L 21/265* (2006.01)
*H01L 21/306* (2006.01)
*H01L 21/308* (2006.01)
*H01L 29/161* (2006.01)

(52) U.S. Cl.
CPC .. *H01L 21/02532* (2013.01); *H01L 21/26513* (2013.01); *H01L 21/3081* (2013.01); *H01L 21/3083* (2013.01); *H01L 21/30604* (2013.01); *H01L 21/76224* (2013.01); *H01L 29/0653* (2013.01); *H01L 29/161* (2013.01); *H01L 29/165* (2013.01); *H01L 29/665* (2013.01); *H01L 29/6656* (2013.01); *H01L 29/7848* (2013.01)

(58) Field of Classification Search
USPC .......................................................... 438/285
See application file for complete search history.

(56) References Cited

U.S. PATENT DOCUMENTS

2008/0157200 A1    7/2008  Kim
2009/0045411 A1*   2/2009  Lin .................. H01L 29/66553
                                                          257/77

* cited by examiner

Prior Art

Prior art

Prior art

Prior art

Prior art

METHOD OF MANUFACTURING MOSFET

CROSS REFERENCE TO RELATED APPLICATION(S)

This application is a national phase application of PCT Application No. PCT/CN2012/083750, entitled "METHOD FOR MANUFACTURING MOSFET," filed on Oct. 30, 2012, which claims priority to Chinese Application No. 201210407448.6, filed on Oct. 23, 2012, entitled "METHOD FOR MANUFACTURING MOSFET.' Both of the PCT Application and the Chinese Application are incorporated herein by reference in their entireties.

TECHNICAL FIELD

The present disclosure relates to a method for manufacturing a MOSFET, and in particular, to a method for manufacturing a MOSFET having enhanced stress.

BACKGROUND

An important trend in the development of the integrated circuitry technology is scaling down of metal-oxide-semiconductor field effect transistors (MOSFETs) to improve integration level and reduce manufacturing cost. However, the performance of semiconductor materials (e.g., carrier mobility) and the performance of the MOSFETs (e.g., threshold voltage) may also deteriorate as the size of the MOSFETs decreases.

A MOSFET may have increased carrier mobility due to appropriate stress being applied to a channel region thereof, resulting in a reduced ON resistance and an enhanced switching speed of the device. When the device is an n-type MOSFET, tensile stress may be applied to the channel region along a longitudinal direction thereof and compressive stress may be applied to the channel region along a lateral direction thereof, so as to improve the mobility of electrons as the carriers. On the other hand, when the transistor is a p-type MOSFET, compressive stress may be applied to the channel region along the longitudinal direction thereof and tensile stress may be applied to the channel region along the lateral direction thereof, so as to improve the mobility of holes as the carriers.

Desirable stress can be generated by forming a source region and a drain region using a semiconductor material different from that of a semiconductor substrate. For the n-type MOSFET, Si:C source and drain regions formed on a Si substrate may function as a stressor which applies the tensile stress to the channel region along the longitudinal direction thereof. For the p-type MOSFET, SiGe source and drain regions formed on a Si substrate may function as a stressor, which applies the compressive stress to the channel region along the longitudinal direction thereof.

FIGS. 1-4 are schematic views showing semiconductor structures formed in various stages in a flow for manufacturing a MOSFET with enhanced stress according to a method of the prior art, in which FIGS. 1a, 2a, 3a and 4a show cross-section views of the respective semiconductor structures along a longitudinal direction of a channel region, FIGS. 3b and 4b show cross-section views of the respective semiconductor structures along a lateral direction of the channel region, and FIGS. 1b, 2b, 3c and 4c show top views of the respective semiconductor structures. In these figures, line AA represents a position where the cross-section views are taken along the longitudinal direction of the channel region, and line BB represents a position where the cross-section views are taken along the lateral direction of the channel region.

This method begins with the semiconductor structure shown in FIGS. 1a and 1b, in which a shallow trench isolation 102 is formed in a semiconductor substrate 101 to define an active region for the MOSFET. A gate stack surrounded by a spacer 105 is formed on the semiconductor substrate 101. The gate stack comprises a gate dielectric 103 and a gate conductor 104.

By using the shallow trench isolation 102, the gate conductor 104 and the spacer 105 as a hard mask, the semiconductor substrate 101 is etched to a desired depth so as to form openings in the semiconductor substrate at positions corresponding to a source region and a drain region, respectively, as shown in FIGS. 2a and 2b.

A semiconductor layer 106 is grown epitaxially on an exposed surface of the semiconductor substrate 101 within each of the openings so as to form the source region and the drain region. A portion of the semiconductor substrate 101, which is beneath the gate dielectric 103 and between the source region and the drain region, functions as a channel region.

The semiconductor layer 106 is grown selectively from the surface of the semiconductor substrate 101. That is, the semiconductor layer 106 is grown at different growth rates on different crystalline surfaces of the semiconductor substrate 101. In an example in which the semiconductor substrate 101 comprises Si and the semiconductor layer 106 comprises SiGe, the semiconductor layer 106 has a slowest growth rate on a crystallographic surface {1 1 1} of the semiconductor substrate 101. As a result, the formed semiconductor layer 106 comprises not only a main plane (100) parallel to the surface of the semiconductor substrate 101, but also facets {1 1 1} at positions adjoining the shallow trench isolation 102 and the spacer 105, which is called an edge effect of the growth of the semiconductor layer 106, as shown in FIGS. 3a, 3b and 3c.

However, the small facets of the semiconductor layer 106 are not desirable because they cause more free surfaces, which release stress from the semiconductor layer 106, thereby reducing the stress applied to the channel region.

Next, the surface of the semiconductor layer 106 is silicidated to form a metal silicide layer 107, as shown in FIGS. 4a, 4b and 4c. The silicidation consumes a part of the semiconductor layer 106. Due to the existence of the small facets of the semiconductor layer 106, the silicidation may occur along the small facets and finally may even reach the semiconductor substrate 101.

However, the silicidation in the semiconductor substrate 101 is undesirable because it may form the metal silicide in a junction region, which leads to increased junction leakage.

Thus, it is desirable to suppress the edge effect in the semiconductor layer of the source and drain regions in the MOSFET with enhanced stress.

SUMMARY OF THE INVENTION

The present disclosure aims to provide, among others, a method for manufacturing a MOSFET with enhanced channel stress and/or reduced junction leakage.

According to an aspect of the present disclosure, there is provided a method for manufacturing a MOSFET, comprising: forming a shallow trench isolation in a semiconductor substrate to define an active region for the MOSFET; performing etching with the shallow trench isolation as a hard mask so that a surface of the semiconductor substrate is exposed and a portion of the shallow trench isolation protrudes with respect to the surface of the semiconductor substrate to form a protruding portion; forming a first spacer on sidewalls of the protruding portion of the shallow trench isolation; forming a gate stack on the semiconductor substrate; forming a second spacer surrounding the gate stack; forming openings in the semiconductor substrate with the shallow trench isolation, the gate stack, the first spacer and the second spacer as a hard mask; epitaxially growing a semiconductor layer by using a bottom surface and sidewalls of each of the openings as a growth seed layer; and performing ion implantation into the semiconductor layer to form a source region and a drain region.

According to this method, stress can be applied to a channel region in the semiconductor substrate by the source region and the drain region made of the semiconductor layer. Since the bottom surface and sidewalls of the opening is taken as the growth seed layer during the epitaxial growth, the semiconductor layer may fill up the opening in the semiconductor substrate completely. The semiconductor layer may have a {1 1 1} facet only present in a subsequently grown portion thereof, thereby suppressing the edge effect.

BRIEF DESCRIPTION OF THE DRAWINGS

FIGS. 1-4 are schematic views showing semiconductor structures formed in various stages in a flow for manufacturing a MOSFET with enhanced stress according to a method of the prior art, in which

FIGS. 5-15 are schematic views showing semiconductor structures formed in various stages in a flow for manufacturing a MOSFET with enhanced stress according to an embodiment of the present disclosure, in which FIGS. 5-8, 9a, 10a, 11a, 12a, 13a, 14a, and 15a show cross-section views of the respective semiconductor structures along a longitudinal direction of a channel region.

DETAILED DESCRIPTION

Figure 1A:
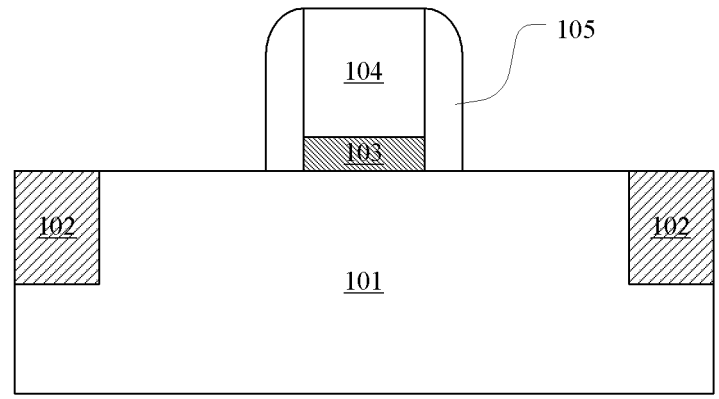
FIGS. 1a, 2a, 3a and 4a show cross-section views of the respective semiconductor structures along a longitudinal direction of a channel region.
Figure 1B:
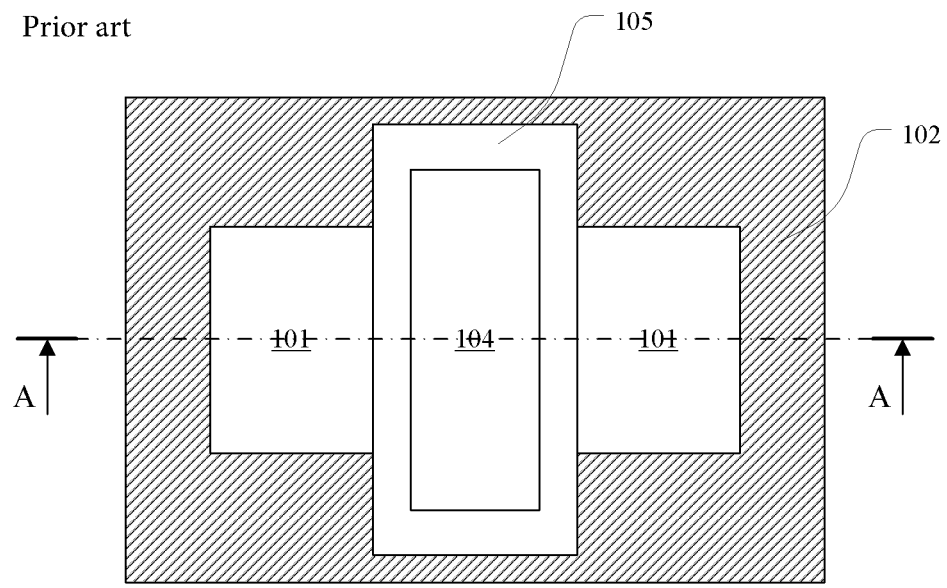
FIGS. 1b, 2b, 3c and 4c show top views of the respective semiconductor structures.
Figure 2A:
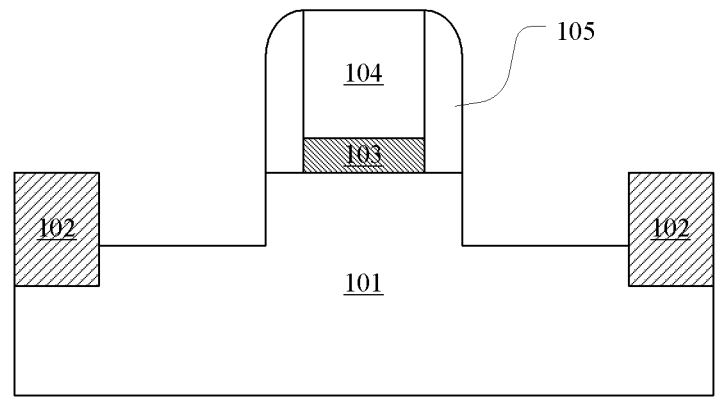
Figure 2B:
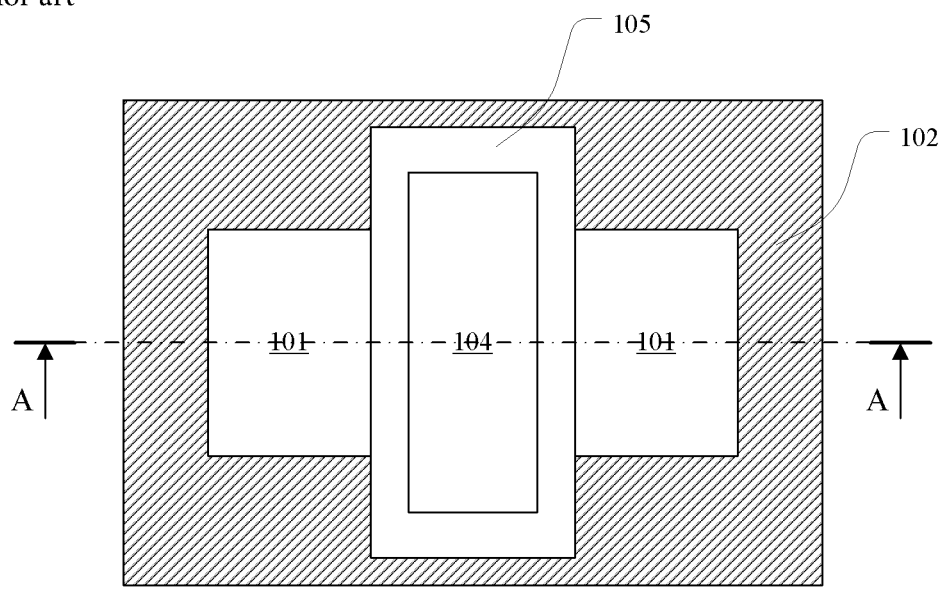
Figure 3A:
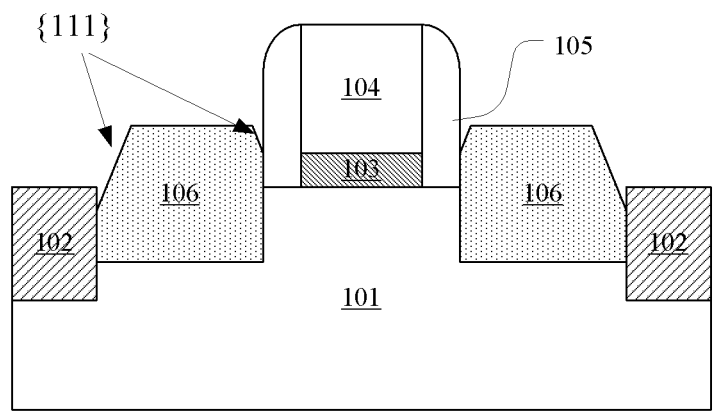
Figure 3B:
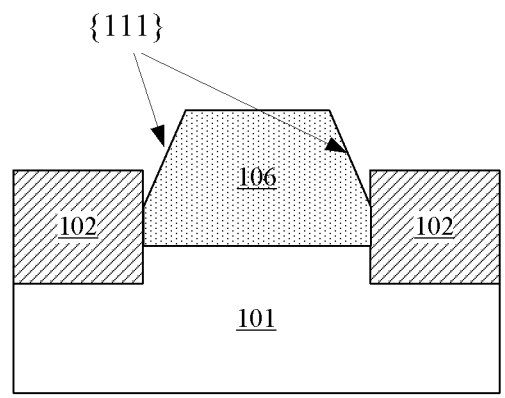
FIGS. 3b and 4b show cross-section views of the respective semiconductor structures along a lateral direction of the channel region.
Figure 3C:
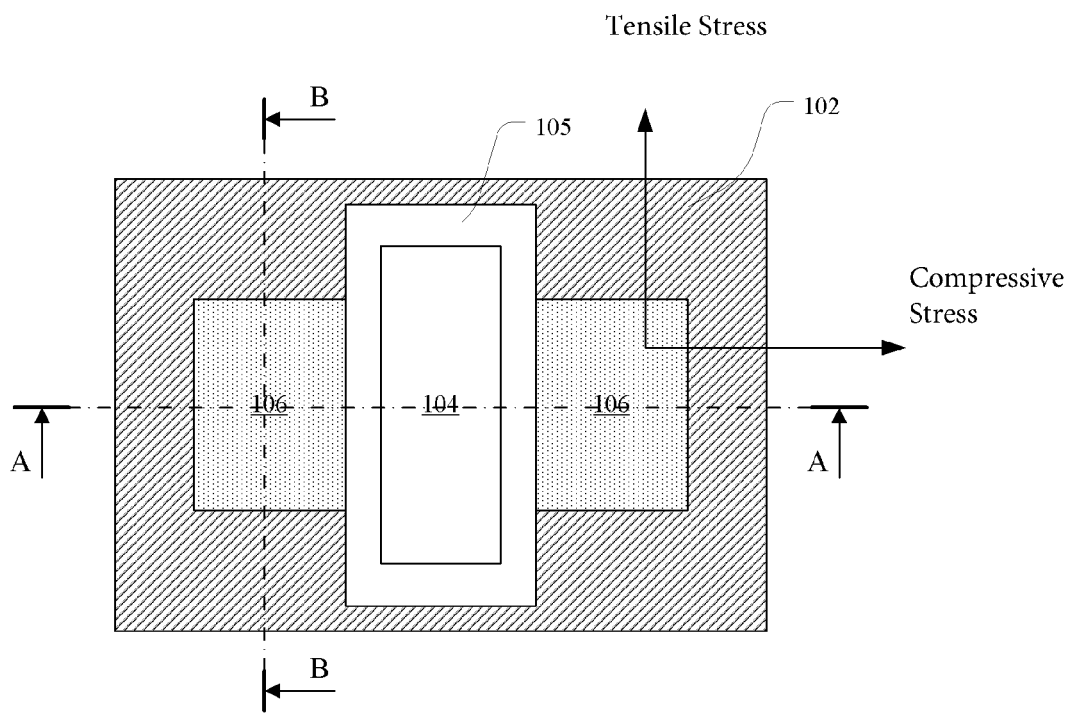
Figure 4A:
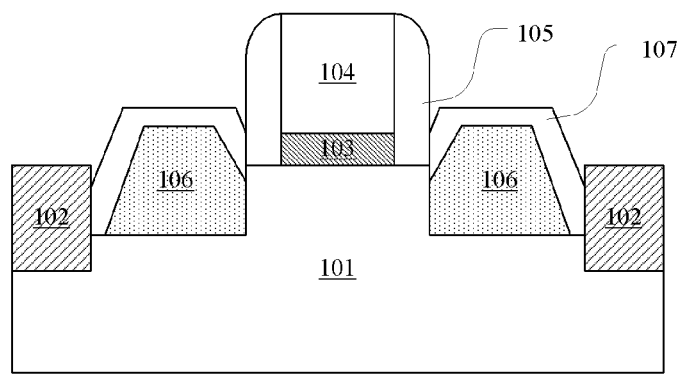
Figure 4B:
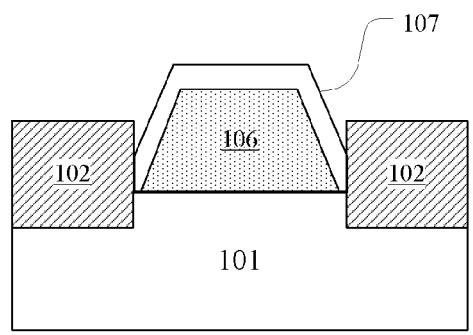
Figure 4C:
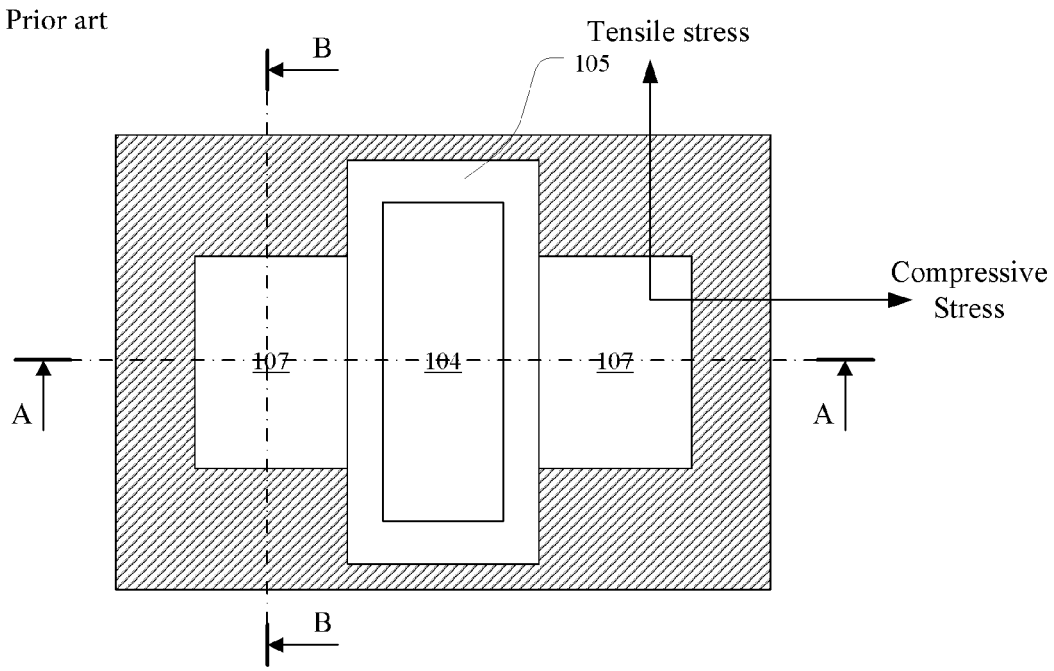

Exemplary embodiments of the present disclosure are described in detail below with reference to the accompanying drawings. In the drawings, like reference numerals denote like elements. The figures are not necessarily drawn to scale, for the sake of clarity.

A semiconductor structure obtained by several steps may be illustrated in one figure, for the sake of conciseness.

In descriptions of structures, when one layer or region is referred to as being "above" or "on" another layer or region, it can be directly above or on the other layer or region, or other layer(s) or region(s) may be arranged there between. Moreover, if the structure in the figures is turned over, the layer or region will be "under" or "below" the other layer or region.

In order to illustrate a situation in which one layer or region is directly on another layer or region, expressions such as "directly on" or "on and adjoining" may be utilized.

In the present disclosure, the term "semiconductor structure" refers generally to an entire semiconductor structure formed through various steps, which have been performed, of a method for manufacturing a semiconductor device, including all of the layers and regions that have been formed. The term "a longitudinal direction of a channel region" refers to a direction from a source region to a drain region or vice versa. The term "a lateral direction of a channel region" refers to a direction perpendicular to the longitudinal direction of the channel region in a plane parallel to a main surface of a semiconductor substrate. For example, for a MOSFET formed on a {1 0 0} silicon wafer, the longitudinal direction of the channel region is typically along a <110> direction of the silicon wafer and the lateral direction of the channel region is typically along a <011> direction of the silicon wafer.

Next, some particular details of the disclosure, such as exemplary structures, materials, dimensions, process steps and technologies, will be described for a better understanding of the present disclosure. Nevertheless, it should be understood by one skilled person in the art that the disclosure can be implemented without these details.

Unless indicated otherwise, each part of a MOSFET can be made of material(s) well-known to one skilled person in the art. A semiconductor material may comprise, for example, a III-V group semiconductor material such as GaAs, InP, GaN and SiC, or a IV group semiconductor such as Si and Ge. A gate conductor may comprise any of various conductive materials, for example, metal, doped polysilicon, a multilayer gate conductor including a metal layer and a doped polysilicon layer, or any other conductive material, such as TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, HfRu, RuOx, or any combination thereof. A gate dielectric may comprise $SiO_2$ or any other dielectric material, which has a dielectric constant greater than that of $SiO_2$, such as oxide, nitride, oxynitride, silicate, aluminate, or titanate. The oxide may include, for example, $SiO_2$, $HfO_2$, $ZrO_2$, $Al_2O_3$, $TiO_2$, or $La_2O_3$. The nitride may include, for example, $Si_3N_4$. The silicate may include, for example, HfSiOx. The aluminate may include, for example, $LaAlO_3$. The titanate may include, for example, $SrTiO_3$. The oxynitride may include, for example, SiON. Moreover, the gate dielectric may comprise any material that will be developed in the future, besides the above known materials.

According to embodiments of the present disclosure, a MOSFET with enhanced stress is manufactured by the following steps, which are described with reference to FIGS. 5-15. The figures schematically show cross-section views of semiconductor structures obtained in various stages of the method. Top views are shown as necessary in the figures, in which line AA represents a position where the cross-section views are taken along a longitudinal direction of a channel region.

Figure 5:
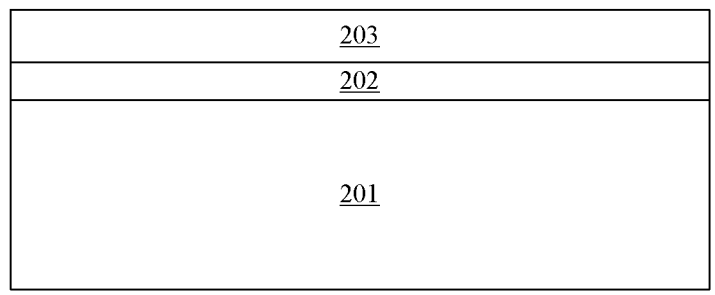

The method begins with a semiconductor structure shown in FIG. 5, in which a pad oxide layer 202 and a pad nitride layer 203 are formed in sequence on a semiconductor substrate 201. The semiconductor substrate 201 may comprise Si, for example. The pad oxide layer 202 may comprise silicon oxide and have a thickness of about 2-5 nm, for example. The pad nitride layer 203 may comprise silicon nitride and have a thickness of about 10-50 nm, for example. The pad oxide layer 202 may decrease stress between the semiconductor substrate 201 and the pad nitride layer 203 as well known. The pad nitride layer 205 may be used as a hard mask in a subsequent etching step.

The respective layers described above may be formed by known processes. The pad oxide layer 202 may be formed by thermal oxidation, for example. The pad nitride layer 203 may be formed by Chemical Vapor Deposition, for example.

Then, a photoresist layer (not shown) is formed on the pad nitride layer 203 by spin-coating and the photoresist layer is subjected to a photolithography process including exposure and development to form a pattern for a shallow trench isolation. By using the photoresist layer as a mask, exposed portions of the pad nitride layer 203 and the pad oxide layer 202 are removed in sequence by dry etching such as ion milling, plasma etching, reactive ion etching, or laser ablation, or wet etching using an etching agent solution. The etching stops on a surface of the semiconductor substrate 201 and forms a pattern of the shallow trench isolation in the pad nitride layer 203 and the pad oxide layer 202. The photoresist layer is removed by ashing or being solved in a solvent.

Figure 6:
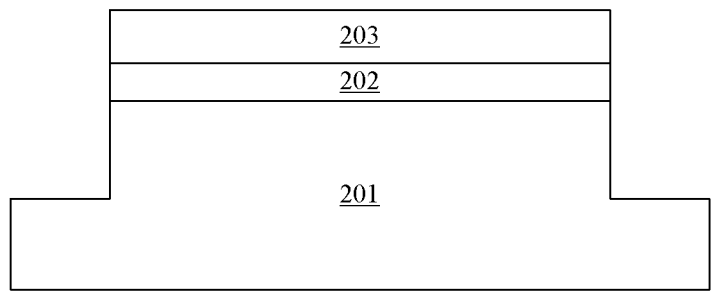

By using the pad nitride 203 and the pad oxide layer 202 together as a hard mask, the semiconductor substrate 201 is etched to a desired depth by dry etching or wet etching, so as to form a shallow trench in the semiconductor substrate 201, as shown FIG. 6.

Figure 7:
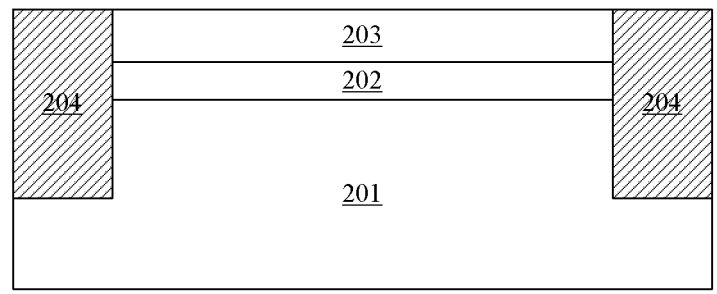

Next, an insulating material layer (not shown) is formed on a surface of the resultant semiconductor structure by deposition. The insulating material layer fills the shallow trench. Portions of the insulting material layer outside the shallow trench are removed by CMP (Chemical Mechanical Polishing). The portion of the insulating material remaining in the shallow trench forms the shallow trench isolation 204, as shown in FIG. 7. The shallow trench isolation 204 defines an active region for the MOSFET. A first portion of the shallow trench isolation 204 has a slant sidewall.

Figure 8:
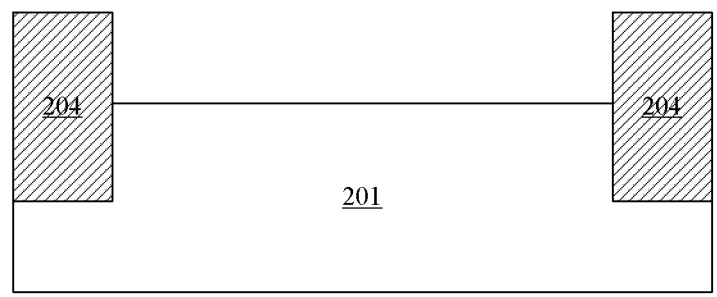

Furthermore, by using the shallow trench isolation 204 as a hard mask, the pad nitride layer 203 and the pad oxide layer 202 are removed by dry etching or wet etching, so as to expose the surface of the semiconductor substrate 201, as shown in FIG. 8. Due to the selectivity of the etching, the shallow trench isolation 204 is substantially not etched, and thereby a portion thereof protrudes with respect to the surface of the semiconductor substrate 201. The protruding portion of the shallow trench isolation 204 protrudes by a length substantially equal to a sum of the thickness of the pad nitride layer 203 and that of the pad oxide layer 202. If necessary, the semiconductor substrate 201 may be further etched with respect to the shallow trench isolation 204 so as to increase the length of the protruding portion of the shallow trench isolation 204. The protruding portion of the shallow trench isolation 204 comprises exposed top and side surfaces.

Figure 9A:
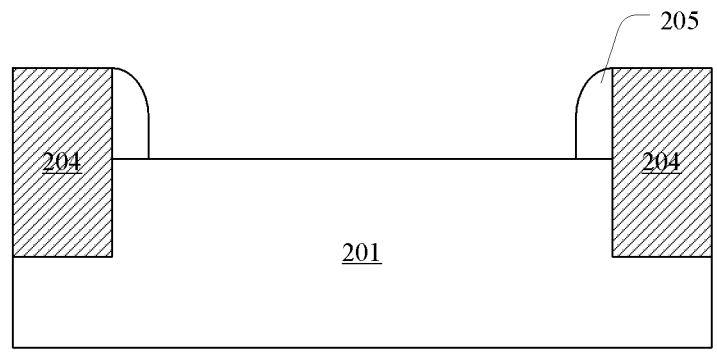
Figure 9B:
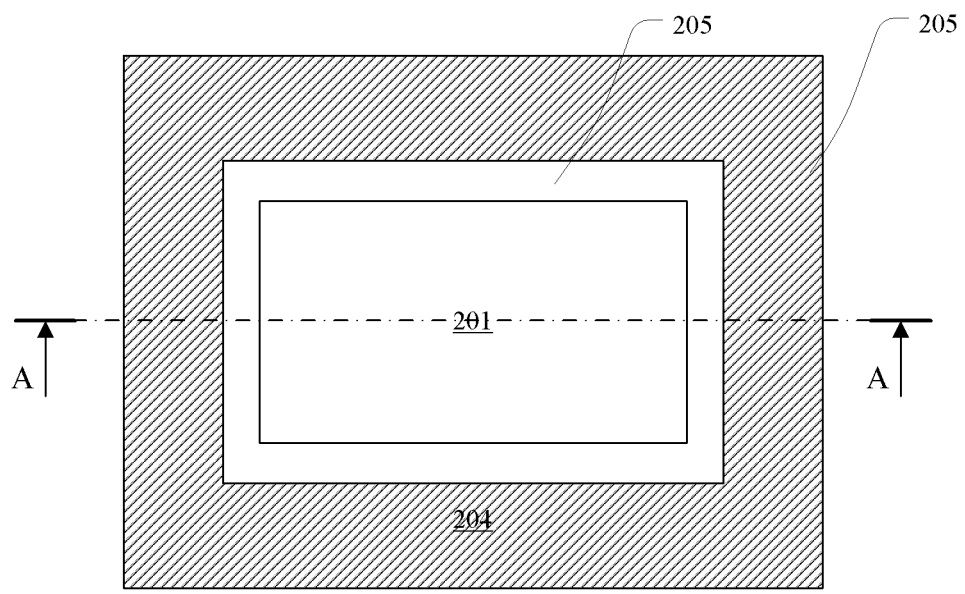
FIGS. 9b, 10b, 11b, 12b, 13b, 14b, and 15b show top views of the respective semiconductor structures.
Figure 10A:
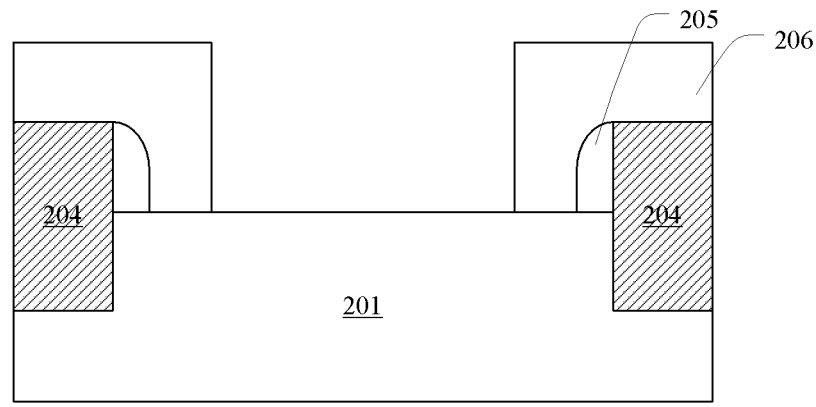
Figure 10B:
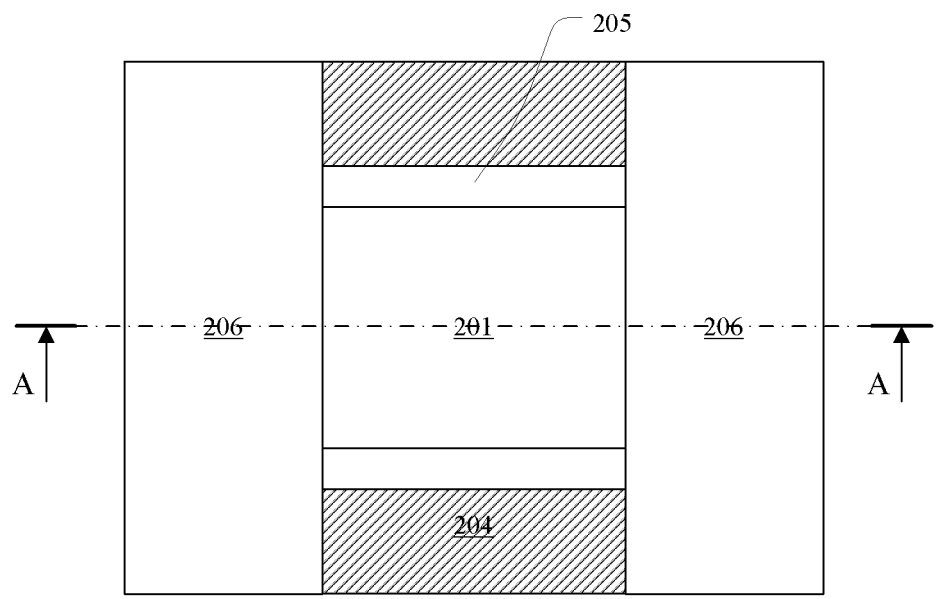

Next, a nitride layer with a thickness of for example 10-50 nm is deposited on the surface of the resultant semiconductor structure by deposition, and then etched anisotropically to form a spacer 205 surrounding sidewalls of the protruding portion of the shallow trench isolation 204, as shown in FIGS. 9a and 9b. Similarly to the shallow trench isolation 204, the spacer 205 surrounds the active region of the semiconductor substrate 201.

Figure 11A:
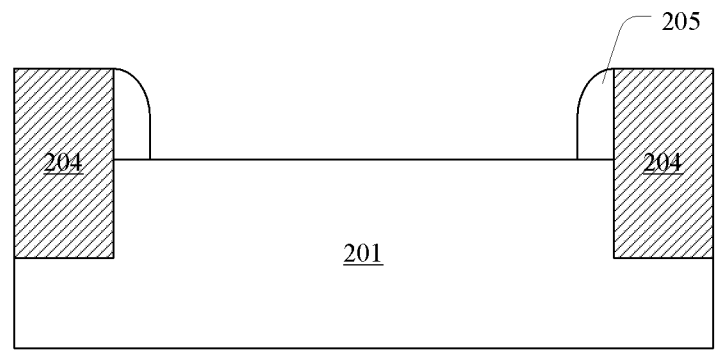
Figure 11B:
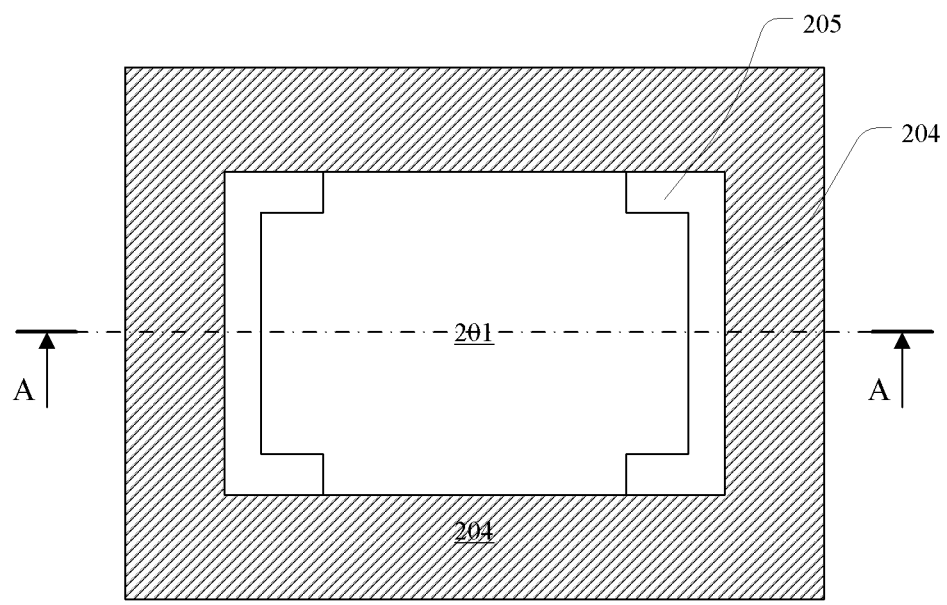

Then, a photoresist layer 206 is formed on the resulting semiconductor structure by spin-coating, and the photoresist layer 206 is patterned by a photolithography process including exposure and development to shield regions where source and drain regions are to be formed and to expose a region where a gate is to be formed. By using the photoresist layer as a mask, a portion of the spacer 205 in the region where the gate is to be formed is selectively removed by dry etching such as ion milling, plasma etching, reactive ion etching, or laser ablation, or wet etching using an etching agent solution, as shown in FIGS. 11a and 11b. This step is preferable, and is performed to expose the steep shallow trench isolation 204 below the spacer 205. In a subsequent step of depositing a poly silicon layer, the poly silicon layer formed on the shallow trench isolation 204 also has a steep profile, thereby improving the performance of the device.

Figure 12A:
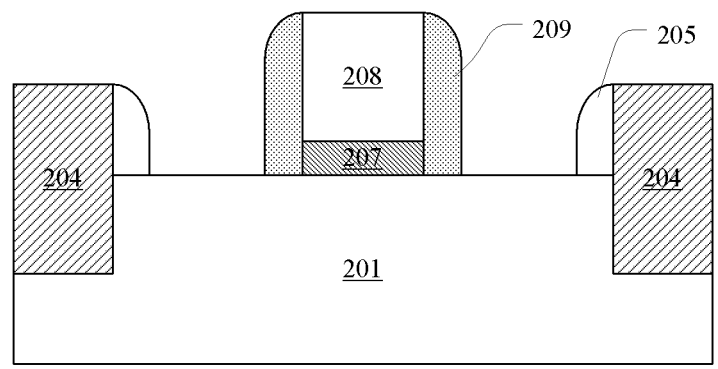
Figure 12B:
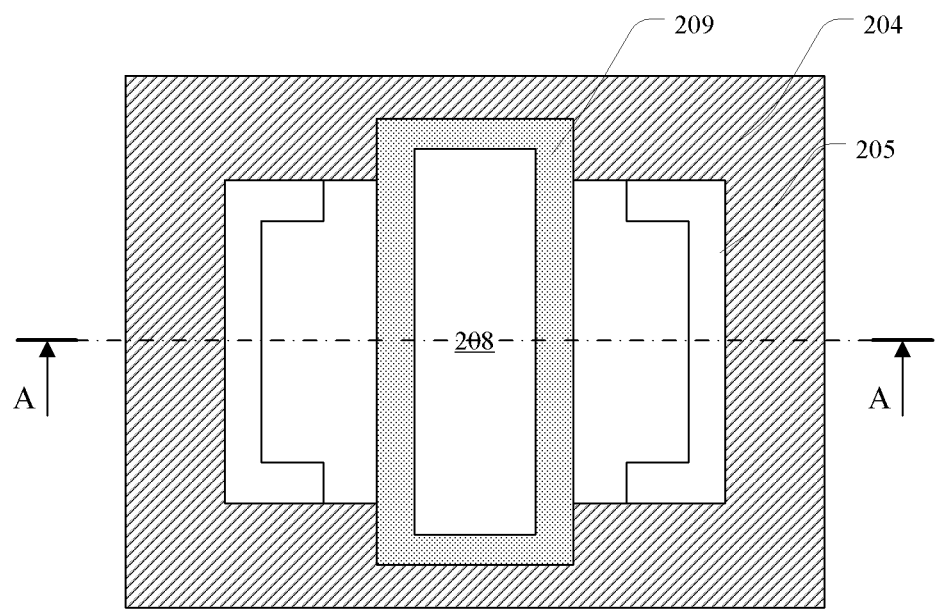

The photoresist layer is then removed by ashing or being dissolved in a solvent. A dielectric layer and a poly silicon layer are formed in turn on a surface of the resultant semiconductor structure by deposition, and then patterned to form a gate stack including a gate dielectric 207 and a gate conductor 208. Next, a nitride layer with a thickness of for example 10-50 nm is deposited on the whole surface of the semiconductor structure by any of the above described processes, and then etched anisotropically to form a spacer 209 surrounding the gate stack, as shown in FIGS. 12a and 12b.

Figure 13A:
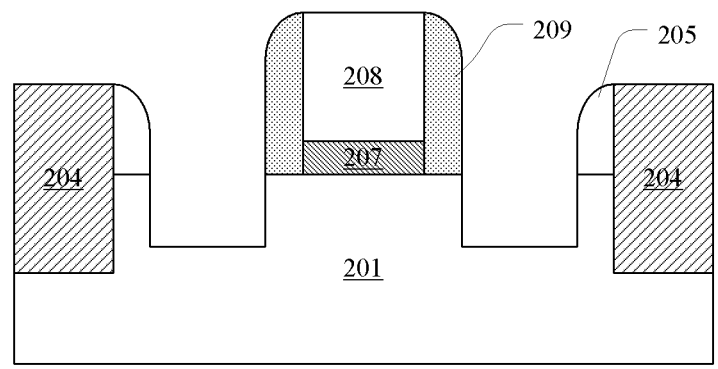
Figure 13B:
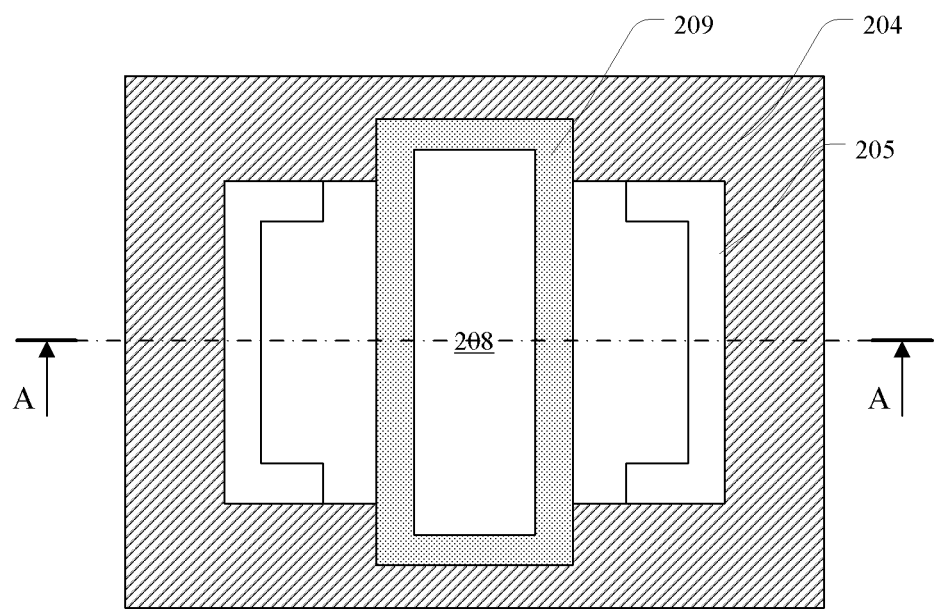

By using the shallow trench isolation 204, the spacer 205, the gate conductor 208 and the spacer 209 as a hard mask, the semiconductor substrate 201 is etched to a desired depth, so as to form openings in the semiconductor substrate 201 at positions corresponding to the source and drain regions, as shown in FIGS. 13a and 13b. The etching is anisotropic, and appropriate etchant and etching conditions are chosen so that the openings each have a shape substantially consistent with that of the hard mask. That is to say, the openings each have an upright sidewall. Due to the spacer 205, a portion of the semiconductor substrate 201 adjacent to the shallow trench isolation 204 may be reserved. Thus, each of the openings has substantially all its sidewalls and bottom surface made of the material of the semiconductor substrate 201. Around the gate stack, some portion of the spacer 205 has been etched away previously, and the reserved portion of the spacer 205 may not overlap with the spacer 209 (referring to FIG. 13b). Thus, a small proportion of the sidewalls of the opening may be made of the material of the shallow trench isolation 204.

Next, a semiconductor layer 210 is epitaxially grown within each of the opening sin the semiconductor substrate 201. The semiconductor layer 210 is selectively grown from the bottom surface and the sidewalls of the opening in the semiconductor substrate 201. That is to say, the semiconductor layer 210 is grown at different rates on different crystalline surfaces of the semiconductor substrate 201. In an example in which the semiconductor substrate 201 comprises Si and the semiconductor layer 210 comprises SiGe, the semiconductor layer 210 is grown slowest on a crystalline surface {1 1 1} of the semiconductor substrate 201. However, unlike the prior art, the bottom surface and a large proportion of the sidewalls of the opening in the semiconductor substrate 201 function as the growth seed layer, and thus the semiconductor layer 210 may completely fill up the opening in the semiconductor substrate 201.

Figure 14A:
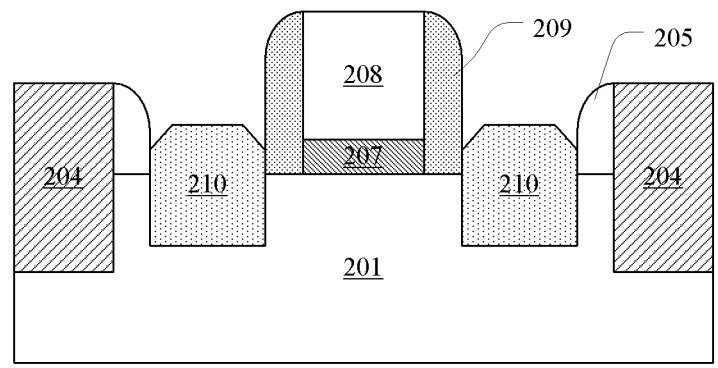
Figure 14B:
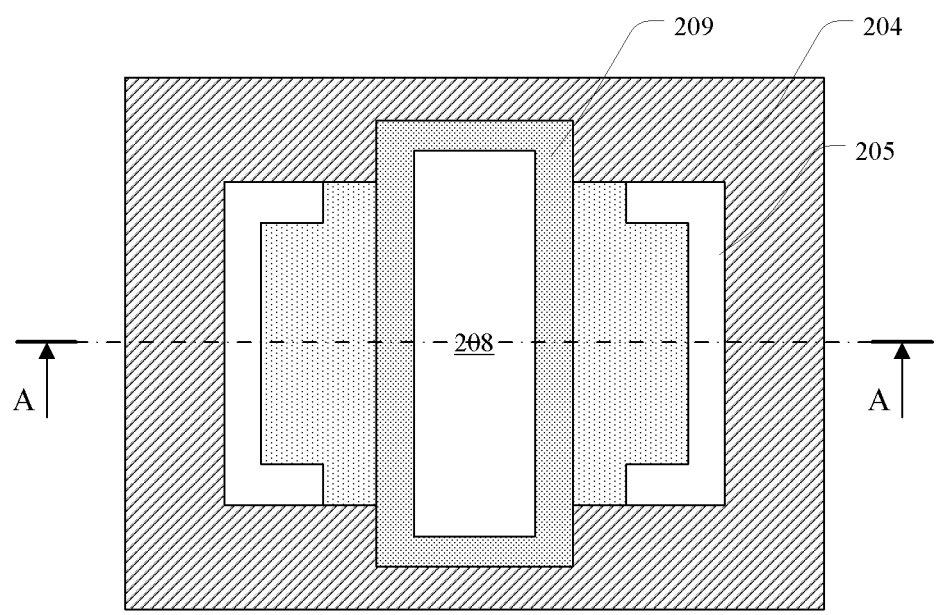

After completely filling up the openings, the semiconductor layer 210 loses the growing seed layer on the sidewalls of the openings, and thus continues being freely epitaxially grown. As a result, the continuously grown portion of the semiconductor layer 210 comprises not only a main surface of (100) parallel to the surface of the semiconductor substrate 201, but also {1 1 1} facets at positions adjacent to the spacer 205 and the spacer 209, as shown in FIGS. 14a and 14b.

The {1 1 1} facet of the semiconductor layer 210 is only present within its continuously grown portion. The portion of the semiconductor layer 210 within the opening of the semiconductor substrate 201 has its bottom surface and sidewalls constrained. Thus, the facets of the semiconductor layer 210 would not disadvantageously affect the stress applied to the channel region.

Although not shown, after steps shown in FIGS. 5-15, ion implantation is implemented into the semiconductor layer 210, and spike anneal may be implemented at a temperature of about 1000-1080° C. to activate dopants implanted in the previous implantation step and eliminate damages caused by the implantation, so as to form the source region and the drain region. A portion of the semiconductor substrate below the gate dielectric 207 and between the source and drain regions functions as the channel region.

Figure 15A:
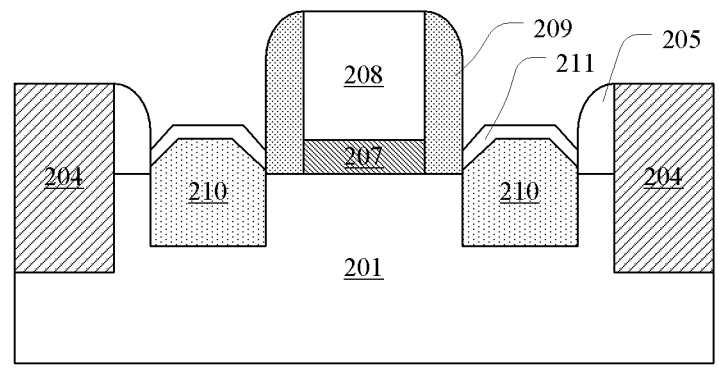
Figure 15B:
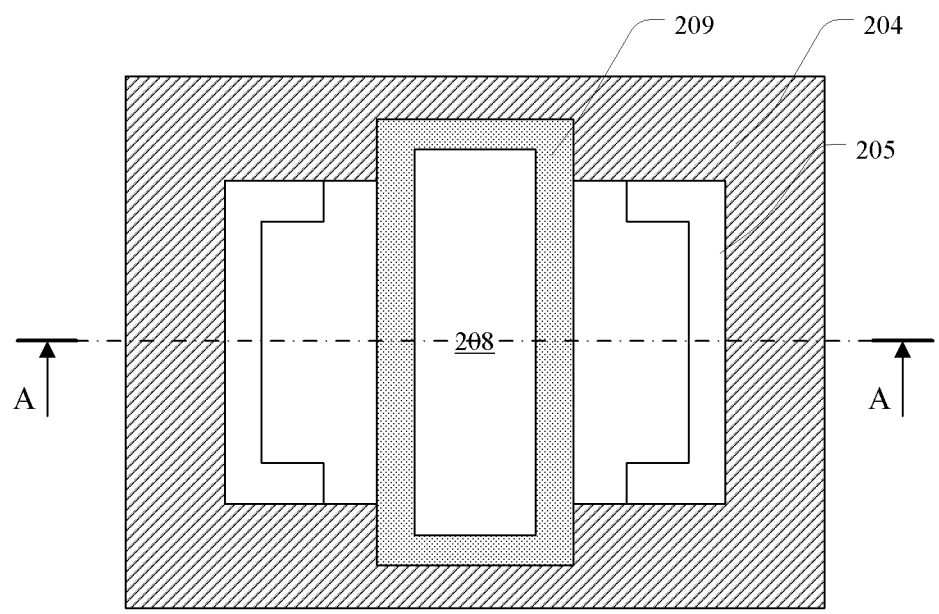

Preferably, silicidation is implemented at the surface of third semiconductor layer 210 to form a metal silicide layer 211 so as to decrease a contact resistance of the source and drain regions, as shown in FIGS. 15a and 15b.

The process of silicidation is known per se. For example, a Ni layer with a thickness of about 5-12 nm is deposited firstly and then is thermally treated at 300-500° C. for 1-10 seconds, so that the surface portion of the semiconductor layer 210 forms NiSi. Finally, the unreacted Ni is etched by wet etching.

The silicidation consumes some of the semiconductor material of the semiconductor layer 210. Since there are the facets of the semiconductor layer 210, the silicidation can occur along the facets. Since the semiconductor layer 210 completely fills up the openings in the semiconductor substrate 201, the silicidation does not reach the semiconductor substrate 201.

After the step shown in FIG. 15, other components of the MOSFET, such as an interlayer insulating layer, a via in the interlayer insulating layer and a wiring or electrode on an upper surface of the interlayer insulating layer, are formed on the resultant semiconductor structure.

In an alternative embodiment, instead of the steps shown in FIGS. 5-8, a shallow trench isolation 204 is formed on the semiconductor substrate 201 in such a manner that the shallow trench isolation 204 has a surface substantially flush with that of the semiconductor substrate 201. By using the shallow trench isolation 204 as a hard mask, a portion of the semiconductor substrate 201 is selectively removed by dry etching or wet etching. Due to the selectivity of the etching, the shallow trench isolation 204 is substantially not etched, thereby a portion of which protrudes with respect to the surface of the semiconductor substrate 201. The etching depth into the semiconductor substrate 201 may be controlled by controlling the etching duration. The etching depth corresponds to the length of the protruding portion of the shallow trench isolation 204. The protruding portion of the shallow trench isolation 204 comprises exposed top and side surfaces.

Although the above embodiment illustrates the p-type MOSFET with enhanced stress and the material for the stressor used therein, the present disclosure is also applicable to an n-type MOSFET with enhanced stress. In the n-type MOSFET, the semiconductor layer 210 comprises, for example, Si:C to form the source and drain regions, and functions as a stressor for applying tensile stress to the channel region along the longitudinal direction thereof. Except for the different materials for the stressor, the n-type MOSFET with enhanced stress may be manufactured in a way similar to the above mentioned one.

The above descriptions are provided only to exemplify and illustrate the present disclosure, but are not intended to limit the present disclosure. Thus, the present disclosure is not limited to the illustrated embodiments. Any variant or modification apparent for those skilled in the art falls in the scope of the present disclosure.

We claim:
1. A method for manufacturing a MOSFET, comprising:
   forming a shallow trench isolation in a semiconductor substrate to define an active region for the MOSFET;
   performing etching with the shallow trench isolation as a hard mask so that a surface of the semiconductor substrate is exposed and a portion of the shallow trench isolation protrudes with respect to the surface of the semiconductor substrate to form a protruding portion;
   forming a first spacer on sidewalls of the protruding portion of the shallow trench isolation;
   forming a gate stack on the semiconductor substrate;
   forming a second spacer surrounding the gate stack;
   forming openings in the semiconductor substrate with the shallow trench isolation, the gate stack, the first spacer and the second spacer as a hard mask, wherein each of the openings has a bottom surface and also sidewalls directly below the first spacer defined by the semiconductor substrate;
   epitaxially growing a semiconductor layer by using the bottom surface and the sidewalls of each of the openings as a growth seed layer; and
   performing ion implantation into the semiconductor layer to form a source region and a drain region.
2. The method according to claim 1, wherein forming the shallow trench isolation comprises:
   forming a first hard mask including a pattern of the shallow trench isolation on the semiconductor substrate;
   etching the semiconductor substrate to form a shallow trench; and
   filling the shallow trench with an insulating material to form the shallow trench isolation.
3. The method according to claim 2, wherein the first hard mask includes a pad oxide layer on the semiconductor substrate and a pad nitride layer on the pad oxide layer.
4. The method according to claim 3, wherein performing etching with the shallow trench isolation as a hard mask comprises:
   selectively removing the hard mask with respect to the shallow trench isolation and the semiconductor substrate.
5. The method according to claim 2, wherein performing etching with the shallow trench isolation as a hard mask comprises:
   selectively removing the hard mask with respect to the shallow trench isolation and the semiconductor substrate.
6. The method according to claim 1, wherein performing etching with the shallow trench isolation as a hard mask comprises:
   selectively etching the semiconductor substrate to a desired depth with respect to the shallow trench isolation.
7. The method according to claim 1, wherein forming the openings comprises:
   forming the openings in the semiconductor substrate by anisotropic etching so that the openings each have an upright sidewall.
8. The method according to claim 1, wherein the MOSFET comprises a p-type MOSFET.
9. The method according to claim 8, wherein the semiconductor substrate comprises Si and the semiconductor layer comprises SiGe.
10. The method according to claim 1, wherein the MOSFET comprises an n-type MOSFET.

11. The method according to claim 10, wherein the semiconductor substrate comprises Si and the semiconductor layer comprises Si:C.

12. The method according to claim 1, wherein between forming the first spacer and forming the gate stack, the method further comprises:
removing a portion of the first spacer at a region where the gate is to be formed.

13. The method according to claim 1, wherein after forming the source and drain regions, the method further comprises:
forming metal silicide on a surface of the source and drain regions by silicidation.

* * * * *